(12) United States Patent
Bae et al.

(10) Patent No.: US 8,759,204 B1
(45) Date of Patent: Jun. 24, 2014

(54) METHOD FOR MANUFACTURING SEMICONDUCTOR SUBSTRATE

(71) Applicant: Electronics and Telecommunications Research Institute, Daejeon (KR)

(72) Inventors: Sung-Bum Bae, Daejeon (KR); Sung Bock Kim, Daejeon (KR); Jae Kyoung Mun, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/897,706

(22) Filed: May 20, 2013

(30) Foreign Application Priority Data

Dec. 24, 2012 (KR) ........................ 10-2012-0152409

(51) Int. Cl.
*H01L 21/20* (2006.01)

(52) U.S. Cl.
USPC ...................... 438/481; 438/503; 258/E21.09

(58) Field of Classification Search
USPC .................................................. 257/E21.094
See application file for complete search history.

(56) References Cited

FOREIGN PATENT DOCUMENTS

KR  10-2007-0115209 A  12/2007
KR  10-2012-0065606 A  6/2012

OTHER PUBLICATIONS

Guan-Ting Chen et al., "Crack-free GaN grown on AlGaN/(111)Si micropillar array fabricated by polystyrene microsphere lithography", Applied Physics Letters, 2007, pp. 261910-1-261910-3, vol. 91, No. 261910.

*Primary Examiner* — Cheung Lee
(74) *Attorney, Agent, or Firm* — Rabin & Berdo, P.C.

(57) ABSTRACT

The inventive concept provides methods for manufacturing a semiconductor substrate. The method may include forming a stop pattern surrounding an edge of a substrate, forming a transition layer an entire top surface of the substrate except the stop pattern, and forming an epitaxial semiconductor layer on the transition layer and the stop pattern. The epitaxial semiconductor layer may not be grown from the stop pattern. That is, the epitaxial semiconductor layer may be isotropically grown from a top surface and a sidewall of the transition layer by a selective isotropic growth method, so that the epitaxial semiconductor layer may gradually cover the stop pattern.

20 Claims, 11 Drawing Sheets

METHOD FOR MANUFACTURING SEMICONDUCTOR SUBSTRATE

CROSS-REFERENCE TO RELATED APPLICATIONS

This U.S. non-provisional patent application claims priority under 35 U.S.C. §119 to Korean Patent Application No. 10-2012-0152409, filed on Dec. 24, 2012, the entirety of which is incorporated by reference herein.

BACKGROUND

The inventive concept relates to a method for manufacturing a semiconductor and, more particularly, to a method for manufacturing an epitaxial semiconductor substrate such as a gallium nitride (GaN) substrate.

A gallium nitride (GaN)-based compound semiconductor corresponds to a direct transition type semiconductor. The GaN-based compound semiconductor may control wavelengths from a visible ray to an ultraviolet ray. Additionally, the GaN-based compound semiconductor may have excellent properties such as high thermal and chemical stability, high electron mobility, and high saturation electron speed as compared with conventional GaAs-based and InP-based compound semiconductors. Thus, the GaN-based compound semiconductor may be widely applied to various fields such as a light emitting diode (LED) of a visible ray region, an optic device (e.g., a laser diode), and electronic devices used in a next-generation wireless communication system and a satellite communication system which require high power and high frequency properties. In particular, a GaN semiconductor growth technique using a large caliber silicon substrate may realize low manufacture costs by mass production, application of a high level silicon semiconductor process technique, and integration with various semiconductors. Thus, various researches are being conducted for the GaN semiconductor growth technique, and the GaN semiconductor growth technique is in its early commercialization stages.

When a high-quality nitride semiconductor is grown on a (111) plane of a silicon substrate having a hexagonal system structure, a stress may occur within the GaN semiconductor by a difference between lattice constants and a difference between thermal expansion coefficients of the silicon substrate and the GaN semiconductor. Thus, a crack may occur in the GaN semiconductor. The crack occurring in the GaN semiconductor may function as a technical barrier in commercialization of optical and electronic devices using a silicon substrate. For resolving the problems, various researches are being conducted for various epitaxial structures and growth techniques.

SUMMARY

Embodiments of the inventive concept may provide a method for manufacturing a semiconductor substrate capable of preventing a crack caused at an edge of the semiconductor substrate.

In one aspect, a method for manufacturing a semiconductor substrate may include: forming a stop pattern surrounding an edge of a substrate; forming a transition layer an entire top surface of the substrate except the stop pattern; and forming an epitaxial semiconductor layer on the transition layer and the stop pattern. The epitaxial semiconductor layer may not be grown from the stop pattern; and the epitaxial semiconductor layer may be isotropically grown from a top surface and a sidewall of the transition layer by a selective isotropic growth method, so that the epitaxial semiconductor layer may gradually cover the stop pattern.

In an embodiment, the epitaxial semiconductor layer may include gallium nitride. The gallium nitride may be formed by a chemical vapor deposition method or an atomic layer deposition method.

In an embodiment, the transition layer may include a superlattice layer. The superlattice layer may include a stack structure of aluminum nitride and gallium nitride. The aluminum nitride and the gallium nitride of the superlattice layer may be formed by a chemical vapor deposition method or an atomic layer deposition method.

In an embodiment, the transition layer may be formed by a selective anisotropic growth method, so that the transition layer may not be grown from the stop pattern but may be grown from an exposed top surface of the substrate.

In an embodiment, the method may further include: forming a buffer layer between the substrate and the transition layer. The buffer layer may include aluminum nitride.

In an embodiment, the stop pattern may include silicon oxide or silicon nitride. The silicon oxide may be formed by a selective thermal oxidation process.

In an embodiment, forming the stop pattern may include: forming a trench in the substrate; forming a dielectric layer on an entire surface of the substrate; and planarizing the dielectric layer until the substrate is exposed.

In another aspect, a method for manufacturing a semiconductor substrate may include: sequentially forming a stop layer and a transition layer on a substrate; patterning the transition layer to form a groove surrounding an edge of the substrate, the groove exposing the stop layer; and forming an epitaxial semiconductor layer on the transition layer and the stop layer. The epitaxial semiconductor layer may not be grown from the stop layer exposed by the groove. The epitaxial semiconductor layer may be isotropically grown from a top surface and a sidewall of the transition layer by a selective isotropic growth method, so that the epitaxial semiconductor layer may gradually cover the stop layer exposed by the groove.

In an embodiment, the epitaxial semiconductor layer may include gallium nitride.

In an embodiment, the transition layer may include a superlattice layer. The superlattice layer may include a stack structure of aluminum nitride and gallium nitride. The aluminum nitride and the gallium nitride of the superlattice layer may be formed by a chemical vapor deposition method or a sputtering method.

In an embodiment, the method may further include: forming a buffer layer between the stop layer and the transition layer.

In an embodiment, the buffer layer may include aluminum nitride.

In an embodiment, the stop layer may be formed of silicon oxide or silicon nitride by a thermal oxidation process or a chemical vapor deposition process.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
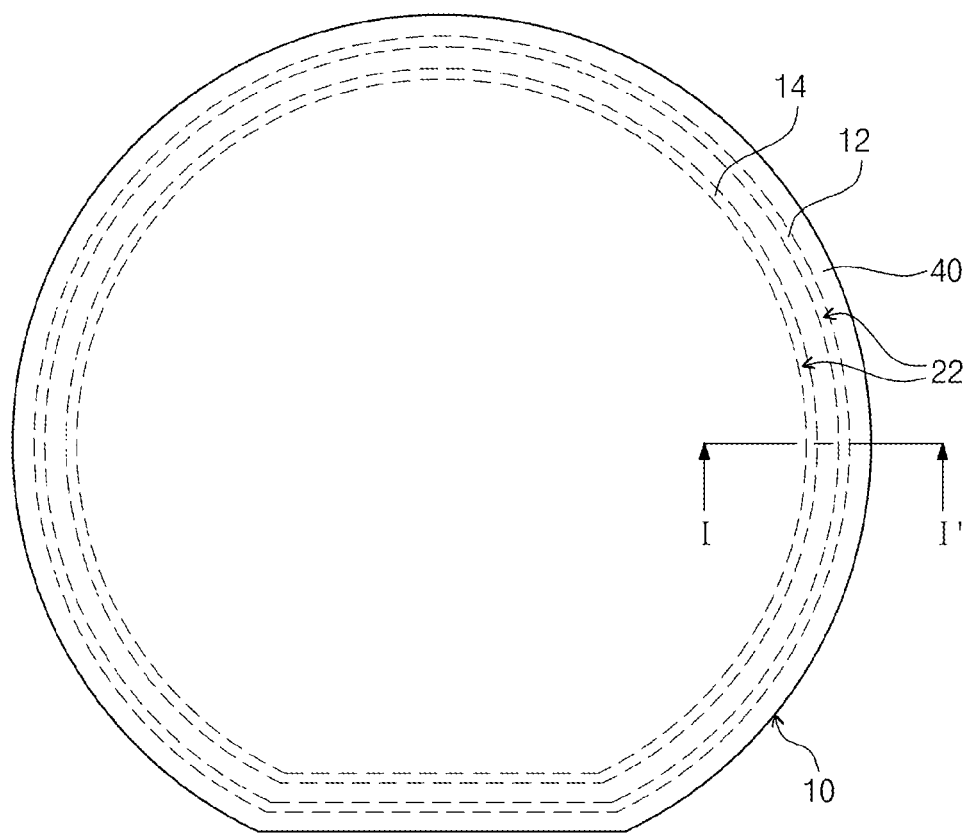
FIG. 1 is a plan view illustrating a semiconductor substrate according to a first embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
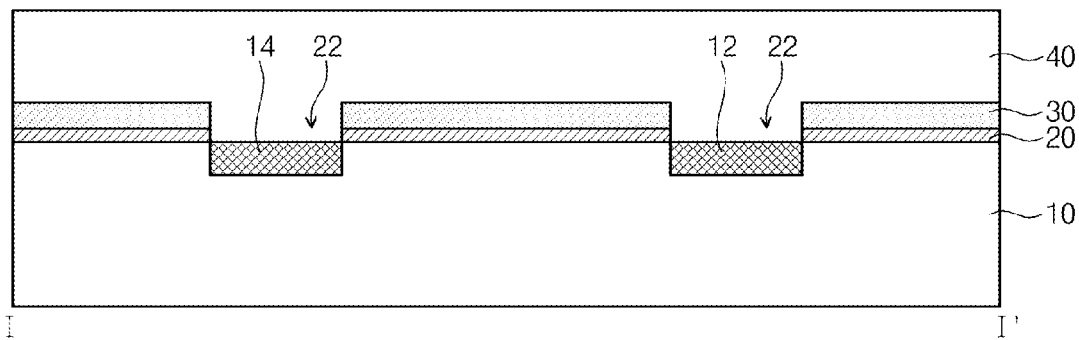
FIG. 2 is a cross-sectional view taken along a line I-I' of FIG. 1.

FIG. 1 is a plan view illustrating a semiconductor substrate according to a first embodiment of the inventive concept. FIG. 2 is a cross-sectional view taken along a line I-I' of FIG. 1.

Referring to FIGS. 1 and 2, a semiconductor substrate 100 may include a base substrate 10, a first stop pattern 12, a second stop pattern 14, a buffer layer 20, a transition layer 30, and an epitaxial semiconductor layer 40.

The base substrate 10 may include crystalline silicon. The base substrate 10 may have a disk-shape or a circular plate. The first stop pattern 12 and the second stop pattern 14 may have ring-shapes surrounding an edge of the base substrate 10. Additionally, the first stop pattern 12 and the second stop pattern 14 may be disposed at a top surface of the base substrate 10. The first stop pattern 12 may be disposed outside the second stop pattern 14 in a plan view. The buffer layer 20 and the transition layer 30 may be disposed on the base substrate 10 except regions in which the first and second stop patterns 12 and 14 are disposed. The buffer layer 20 may include aluminum nitride (AlN). The transition layer 30 may include a superlattice layer. The superlattice layer may include a stack structure of aluminum nitride and gallium nitride (GaN). The epitaxial semiconductor layer 40 may include gallium nitride. The epitaxial semiconductor layer 40 may be in contact with the first stop pattern 12, the second stop pattern 14, the buffer layer 20, and the transition layer 30. Grooves 22 may successively penetrate the transition layer 30 and the buffer layer 20. The grooves 22 may expose the first stop pattern 12 and the second stop pattern 14, respectively. The epitaxial semiconductor layer 40 may fill the grooves 22. Each of the buffer layer 20 and the transition layer 30 may be divided into a center region and an edge region by the grooves 22. A top surface of the epitaxial semiconductor layer 40 may be planarized. A portion of the epitaxial semiconductor layer 40 filling the groove 22 may be thicker than a portion of the epitaxial semiconductor layer 40 disposed on a bottom surface of the groove 22. A crack of the epitaxial semiconductor layer 40 may be prevented by the first and second stop patterns 12 and 14 and/or the grooves 22 when the epitaxial semiconductor layer 40 is grown.

A method for manufacturing the semiconductor substrate 100 described above will be described hereinafter.

FIGS. 3 to 9 based on FIG. 2 are cross-sectional views illustrating a method for manufacturing a semiconductor substrate according to a first embodiment of the inventive concept. FIGS. 3 to 9 are cross-sectional views taken along the line I-I' of FIG. 1.

Figure 3:
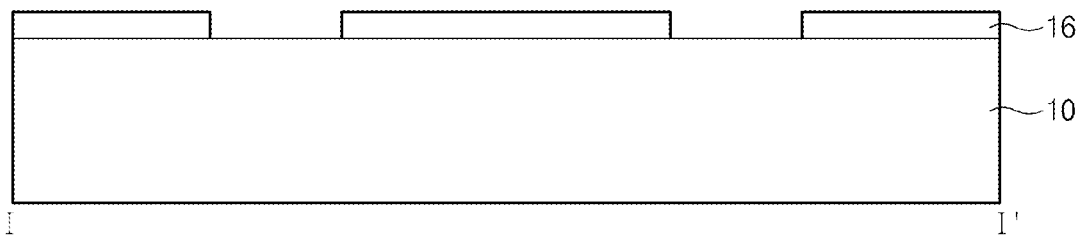
FIGS. 3 to 9 based on FIG. 2 are cross-sectional views illustrating a method for manufacturing a semiconductor substrate according to a first embodiment of the inventive concept.

Referring to FIG. 3, a mask layer 16 is formed on a base substrate 10. The base substrate 10 may include crystalline silicon. The mask layer 16 may include openings exposing the base substrate 10. The mask layer 16 may include a photoresist pattern or a hard mask pattern. The photoresist pattern may be formed by a spin coating process and a photolithography process. The hard mask pattern may include silicon nitride.

Figure 4:
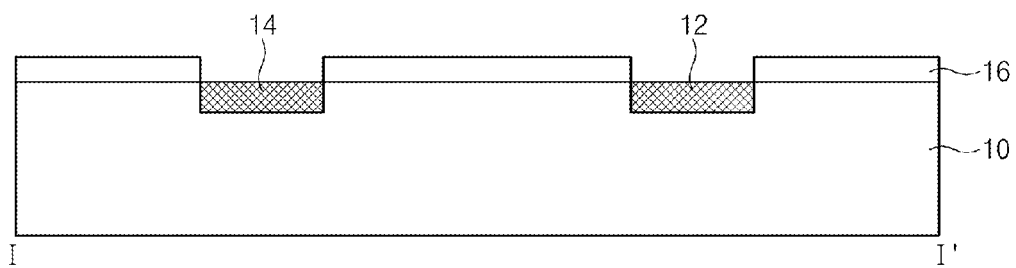

Referring to FIGS. 1 and 4, a first stop pattern 12 and a second stop pattern 14 are formed at a top surface of the base substrate 10. The first stop pattern 12 and the second stop pattern 14 may include silicon oxide. The first and second stop patterns 12 and 14 including silicon oxide may be formed by a selective oxidation process. The silicon oxide may be formed from the top surface of the base substrate 16 exposed by the mask layer 16 to a predetermined depth in the selective oxidation process. The selective oxidation process may include a thermal oxidation process. The first and second stop patterns 12 and 14 may surround an edge of the base substrate 10 in a plan view.

Figure 5:
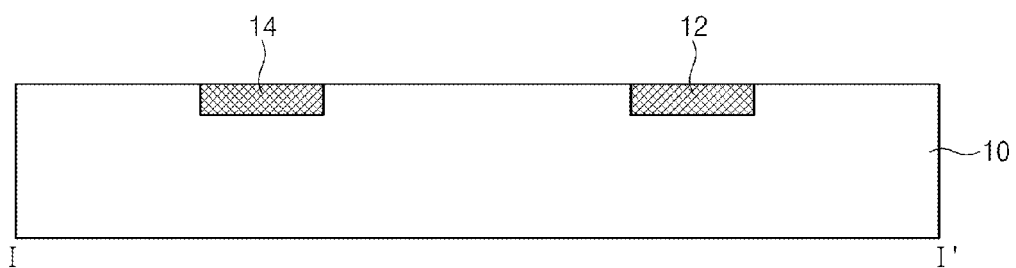

Referring to FIG. 5, the mask layer 16 is removed. If the mask layer 16 is the photoresist pattern, the photoresist pattern may be removed by an organic solvent (e.g., methanol or ethanol) or an ashing process. If the mask layer 16 is the hard mask pattern, the hard mask pattern may be removed by a wet etching method or a dry etching method.

Figure 6:
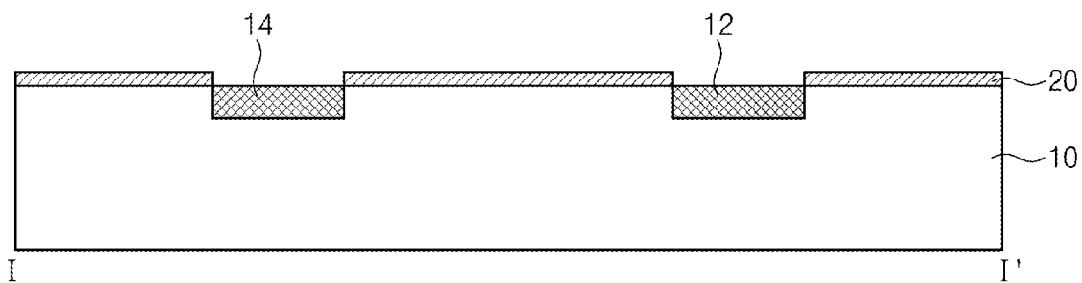

Referring to FIG. 6, a buffer layer 20 is formed on an entire top surface of the base substrate 10 except the first stop pattern 12 and the second stop pattern 14. The buffer layer 20 may include aluminum nitride. The buffer layer 20 may be formed on an exposed top surface of the base substrate 10 except top surfaces of the first and second stop patterns 12 and 14 by a selective anisotropic growth method. The selective anisotropic growth method may include a chemical vapor deposition method or an atomic layer deposition method. The buffer layer 20 may be grown vertically to the top surface of the base substrate 10. The buffer layer 20 may have a thickness of about 10 nm to about 200 nm.

Figure 7:
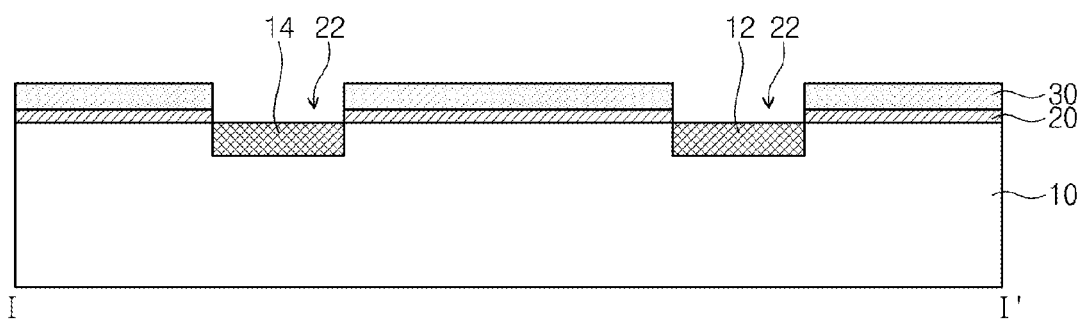

Referring to FIG. 7, a transition layer 30 is formed on the buffer layer 20. The transition layer 30 may be selectively formed on the buffer layer 20. The transition layer 30 may include a superlattice layer. The superlattice layer may have a stack structure of aluminum nitride and gallium nitride. Like the buffer layer 20, the transition layer 30 may be formed by a selective anisotropic growth method of a chemical vapor deposition method or an atomic layer deposition method. The transition layer 30 may have a thickness of about 100 nm to about 1000 nm. Sidewalls of the buffer and transition layers 20 and 30 and the first and second stop patterns 12 and 14 may define grooves 22. The grooves 22 may expose the first and second stop patterns 12 and 14, respectively. In other words, the top surfaces of the first and second stop patterns 12 and 14 may correspond to bottom surfaces of the grooves 22, respectively.

Figure 8:
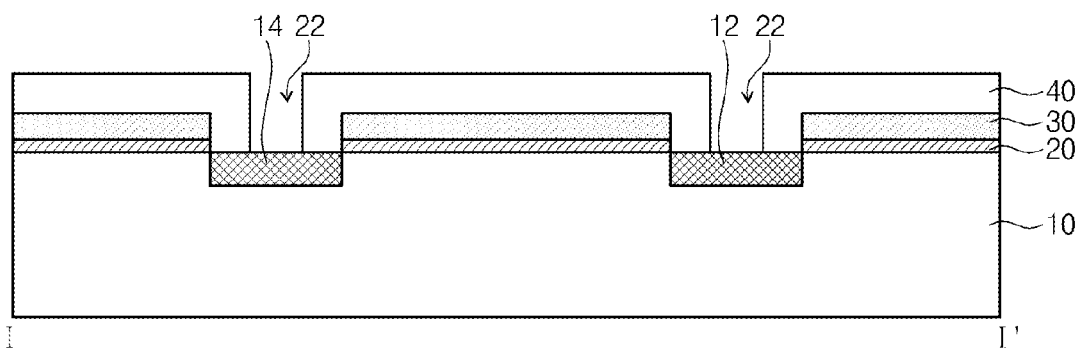

Referring to FIGS. 1, 2, and 8, an epitaxial semiconductor layer 40 is formed on a top surface of the transition layer 30 and on the sidewalls of the transition and buffer layers 30 and 20. The epitaxial semiconductor layer 40 may be formed by a selective isotropic growth method. The selective isotropic growth method may include a chemical vapor deposition method or an atomic layer deposition method. The epitaxial semiconductor layer 40 may not be grown from the first and second stop patterns 12 and 14, but it may be grown from the sidewalls of the buffer and transition layers 20 and 30 and from the top surface of the transition layer 30. Here, the epitaxial semiconductor layer 40 may gradually cover each of the first and second stop patterns 12 and 14. At this time, portions of the epitaxial semiconductor layer are separated from each other on the first and second stop patterns 12 and 14, such that the epitaxial semiconductor layer 40 may be protected from a crack which may occur at the edge of the base substrate 10. Generally, a crack of the epitaxial semiconductor layer 40 may occur from the edge of the base substrate 10. Additionally, the crack may occur by a stress during growth of the epitaxial semiconductor layer 40. The progress of the crack may be stopped at the grooves 22. This is because the epitaxial semiconductor layer 40 through which the crack may proceed does not exist in the grooves 22. In other words, the epitaxial semiconductor layer 40 may be grown on the base substrate 10 in the state that a center portion and an edge portion of the epitaxial semiconductor layer are separated with each other. As a result, the manufacturing method according to the first embodiment of the inventive concept may prevent a crack badness of the epitaxial semiconductor layer 40.

Figure 9:
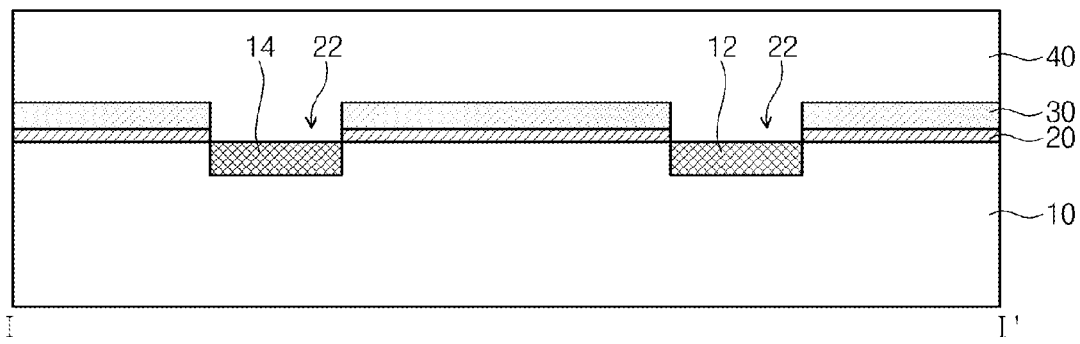

Referring to FIG. 9, the epitaxial semiconductor layer 40 may be planarized. The epitaxial semiconductor layer 40 may cover the first and second stop patterns 12 and 14. The epitaxial semiconductor layer 40 may have a thickness of about 0.5 μm or more.

FIGS. 10 to 13 are cross-sectional views illustrating a method for manufacturing an epitaxial semiconductor layer according to an application example of the inventive concept.

Figure 10:
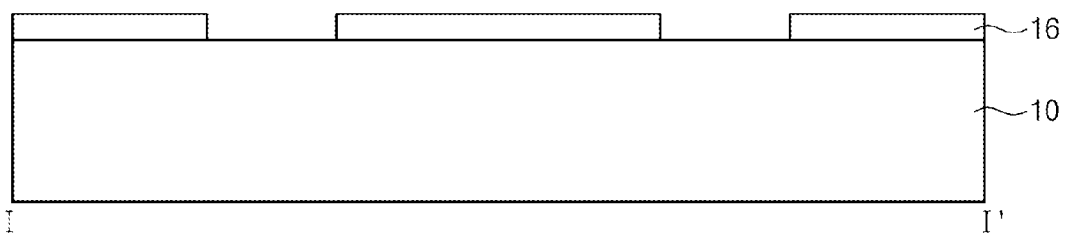
FIGS. 10 to 13 are cross-sectional views illustrating a method for manufacturing an epitaxial semiconductor layer according to an application example of the inventive concept.

Referring to FIG. 10, a mask layer 16 may be formed on a base substrate 10. The mask layer 16 may include openings exposing the base substrate 10. The mask layer 16 may include a photoresist pattern or a hard mask pattern. The hard mask pattern may include silicon oxide or silicon nitride.

Figure 11:
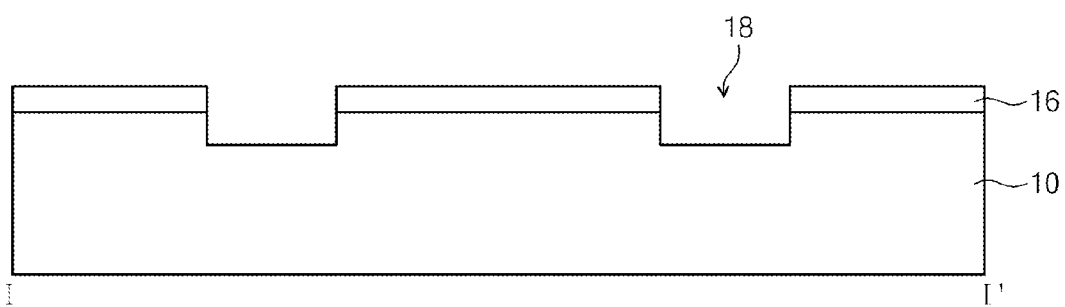

Referring to FIG. 11, the base substrate 10 exposed by the mask layer 16 is etched to form trenches 18. The trenches 18 may surround an edge of the base substrate 10 in a plan view. The trenches 18 may be formed by a dry etching process or a wet etching process. A strong acid such as hydrofluoric acid may etch the base substrate of crystalline silicon. If the mask layer 16 is the hard mask pattern and an etch rate of the base substrate 10 is similar to an etch rate of the hard mask pattern, the hard mask pattern may be removed during the formation of the trench 18.

Figure 12:
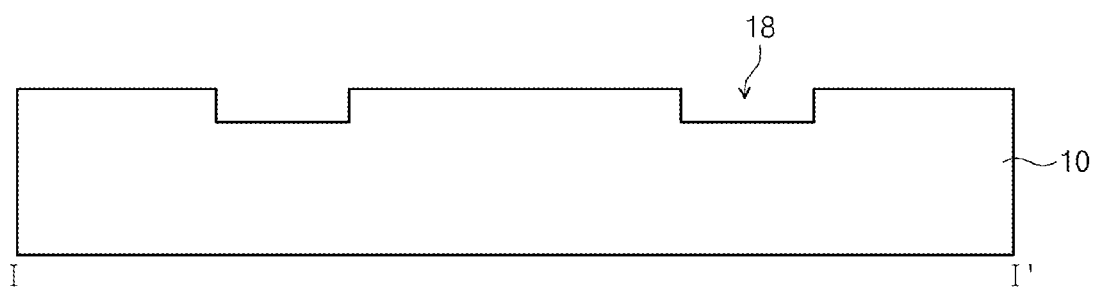

Referring to FIG. 12, the mask layer 16 is removed. If the mask layer 16 is the photoresist pattern, the mask layer 16 may be removed by an organic solvent or an ashing process. If the mask layer 16 is formed of silicon oxide or silicon nitride, the mask layer 16 may be a dry etching process or a wet etching process.

Figure 13:
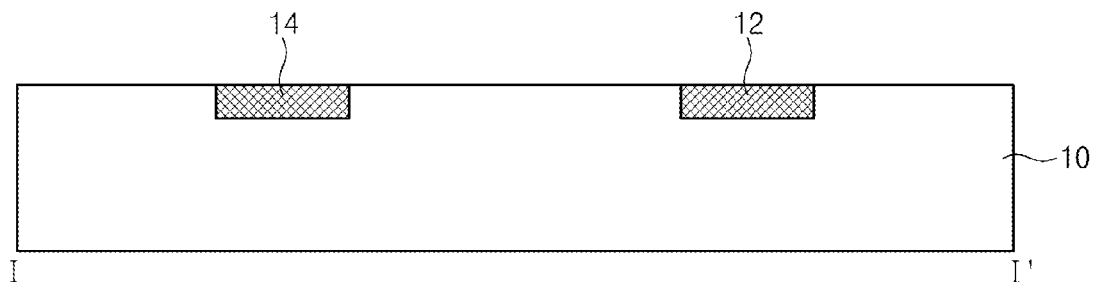

Referring to FIG. 13, a first stop pattern 12 and a second stop pattern 14 are formed in the trenches 18, respectively. The first and second stop patterns 12 and 14 may include silicon nitride. The first and second stop patterns 12 and 14 may be formed by a deposition process and a chemical mechanical polishing (CMP) process. The deposition process may include a chemical vapor deposition process. For example, a dielectric layer may be formed on the entire surface of the base substrate 10 having the trenches 18 by the deposition process, and then the dielectric layer may be planarized by the CMP process until the base substrate 10 is exposed. As a result, the first and second stop patterns 12 and 14 may be formed in the trenches 22, respectively. The first and second stop patterns 12 and 14 may surround the edge of the base substrate 10 in a plan view. In the method for manufacturing the semiconductor substrate according to the application example of the inventive concept, the first and the second stop patterns 12 and 14 fill the trenches 18 formed in the base substrate 10, respectively.

Referring to FIGS. 6 to 9, the buffer layer 20 and the transition layer 30 are sequentially formed on the entire top surface of the base substrate 10 except the first and second stop patterns 12 and 14. The buffer layer 20 may include aluminum nitride. The transition layer 30 may include a superlattice layer. The superlattice layer may have a stack structure of aluminum nitride and gallium nitride. The buffer layer 20 and the transition layer 30 may be formed selective anisotropic growth methods. Sidewalls of the buffer and transition layers 20 and 30 and the first and second stop patterns 12 and 14 may define grooves 22.

Next, the epitaxial semiconductor layer 40 is formed on the top surface of the transition layer 30 and on the sidewalls of the transition and buffer layers 30 and 20. The epitaxial semiconductor layer 40 may be formed by the selective isotropic growth method. The selective isotropic growth method may include a chemical vapor deposition method or an atomic layer deposition method. The epitaxial semiconductor layer 40 may not be grown from the first and second stop patterns 12 and 14, but it may be grown from the sidewalls of the buffer and transition layers 20 and 30 and from the top surface of the transition layer 30. Here, the epitaxial semiconductor layer 40 may gradually cover each of the first and second stop patterns 12 and 14. At this time, portions of the epitaxial semiconductor layer are separated from each other on the first and second stop patterns 12 and 14, such that the epitaxial semiconductor layer 40 may be protected from a crack which may occur at the edge of the base substrate 10. A crack of the epitaxial semiconductor layer 40 may occur from the edge of the base substrate 10. Additionally, the crack may occur by a stress during growth of the epitaxial semiconductor layer 40. The progress of the crack may be stopped at the grooves 22.

Thereafter, the epitaxial semiconductor layer 40 may be planarized. The epitaxial semiconductor layer 40 may cover the first and second stop patterns 12 and 14.

Figure 14:
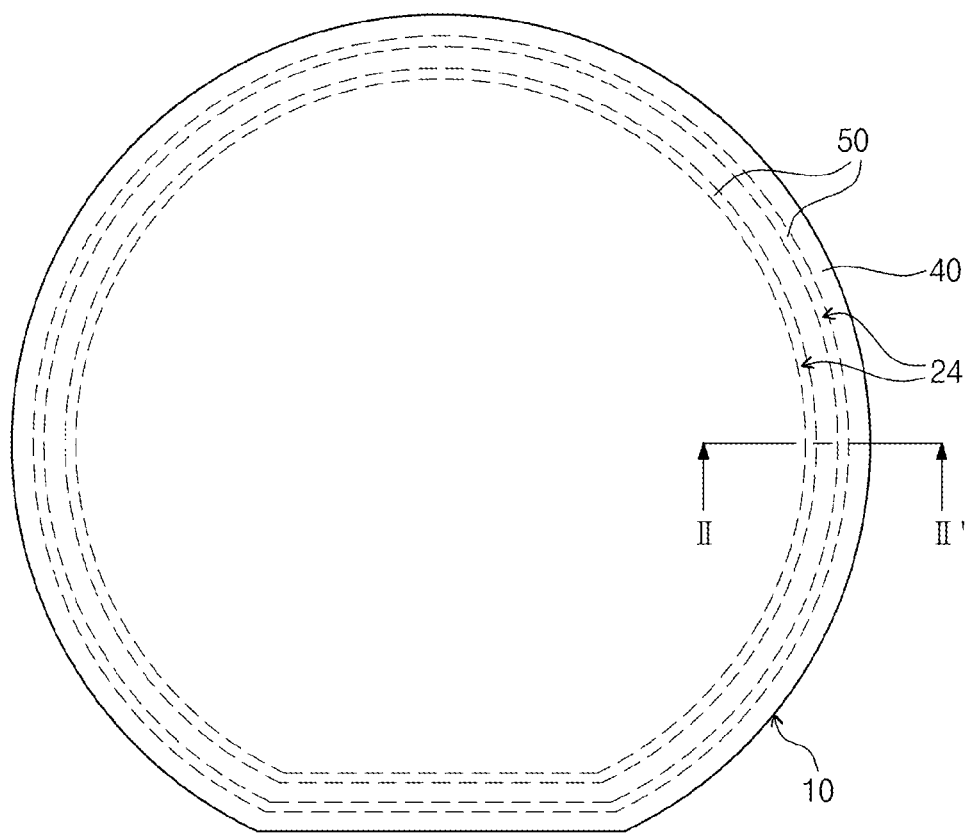
FIG. 14 is a plan view illustrating a semiconductor substrate according to a second embodiment of the inventive concept.
Figure 15:
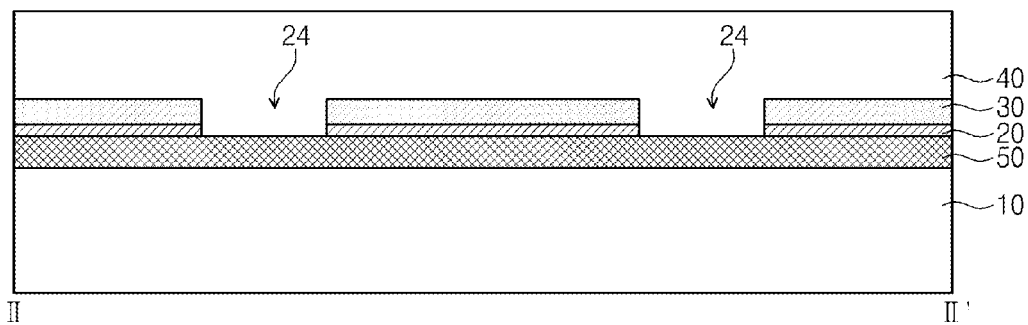
FIG. 15 is a cross-sectional view taken along a line II-II' of FIG. 14.

FIG. 14 is a plan view illustrating a semiconductor substrate according to a second embodiment of the inventive concept. FIG. 15 is a cross-sectional view taken along a line II-II' of FIG. 14.

Referring to FIGS. 14 and 15, a semiconductor substrate 100 according to a second embodiment of the inventive concept may include a base substrate 10, a stop layer 50, a buffer layer 20, a transition layer 30, and an epitaxial semiconductor layer 40. The stop layer 50 may be disposed on an entire top surface of the base substrate 10. The buffer layer 20 and the transition layer 30 may partially cover the stop layer 50. Here, grooves 24 may be defined by the buffer layer 20 and transition layer 30. The grooves 24 may expose portions of the stop layer 50, respectively. The grooves 24 may surround an edge of the base substrate 10 in a plan view. The semiconductor substrate 100 according to the second embodiment of the inventive concept includes the stop layer 50 exposed by the grooves 24 instead of the first and second stop patterns 12 and 14 of the first embodiment.

FIGS. 16 to 20 based on FIG. 15 are cross-sectional views illustrating a method for manufacturing a semiconductor substrate according to a second embodiment of the inventive concept.

Figure 16:
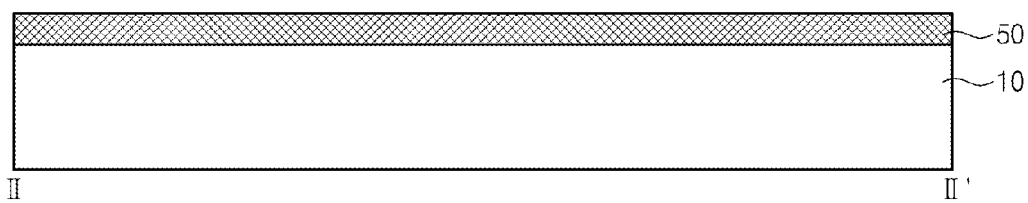
FIGS. 16 to 20 based on FIG. 15 are cross-sectional views illustrating a method for manufacturing a semiconductor substrate according to a second embodiment of the inventive concept.

Referring to FIG. 16, a stop layer 50 is formed on the base substrate 10. The stop layer 50 may be formed on an entire top surface of the base substrate 10. The stop layer 50 may include silicon oxide or silicon nitride. The silicon oxide of the stop layer 50 may be formed by a thermal oxidation process or a chemical vapor deposition process. The silicon nitride of the stop layer 50 may be formed by a chemical vapor deposition process.

Figure 17:
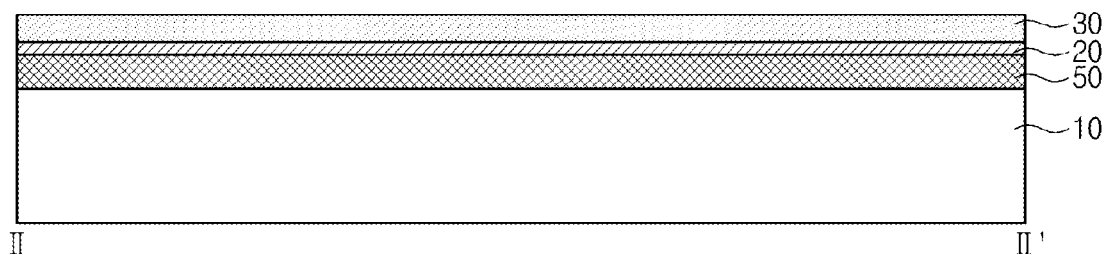

Referring to FIG. 17, a buffer layer 20 and a transition layer 30 are sequentially formed on the stop layer 50. The buffer layer 20 may include aluminum nitride which is formed by a chemical vapor deposition method or a sputtering method.

The transition layer 30 may include a superlattice layer. The superlattice layer may have a stack structure of aluminum nitride and gallium nitride. The transition layer 30 may be formed by a chemical vapor deposition method or a sputtering method.

Figure 18:
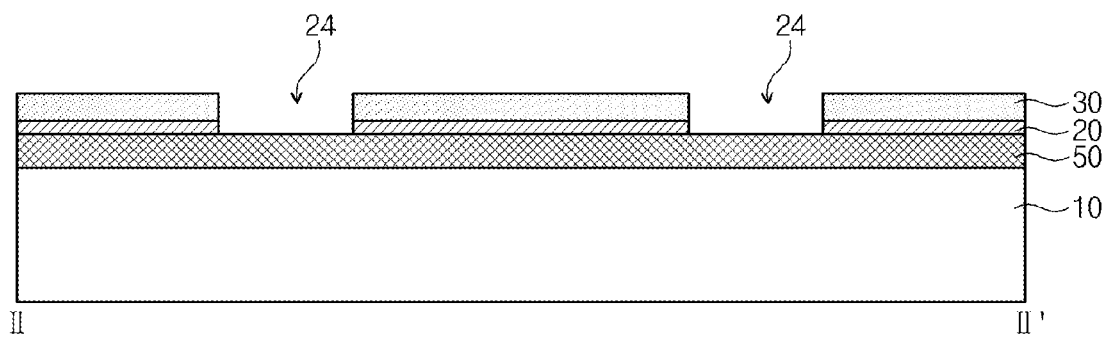

Referring to FIG. 18, the transition layer 30 and the buffer layer 20 are patterned to form grooves 24. The transition layer 30 and the buffer layer 20 may be patterned by a photolithography process and an etching process.

Figure 19:
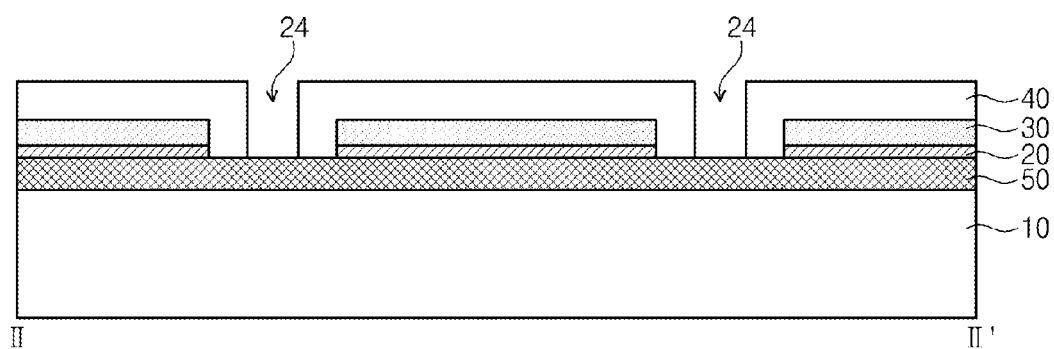

Referring to FIG. 19, an epitaxial semiconductor layer 40 is formed on a top surface of the transition layer 30 and on sidewalls of the transition and buffer layers 30 and 20. The epitaxial semiconductor layer 40 may be formed by a selective isotropic growth method. The selective isotropic growth method may include a chemical vapor deposition method or an atomic layer deposition method. The epitaxial semiconductor layer 40 may not be grown from the stop layer 50 exposed by the grooves 24, but the epitaxial semiconductor layer 40 may be grown from the sidewalls of the buffer and transition layers 20 and 30 and from the top surface of the transition layer 30. Since portions of the epitaxial semiconductor layer are separated from each other on the stop layer 50 exposed by the grooves 24, the epitaxial semiconductor layer 40 may be protected from a crack which may occur at the edge of the base substrate 10. A crack of the epitaxial semiconductor layer 40 may occur from the edge of the base substrate 10. The progress of the crack may be stopped at the grooves 24. As a result, the manufacturing method according to the second embodiment of the inventive concept may prevent a crack badness of the epitaxial semiconductor layer 40.

Figure 20:
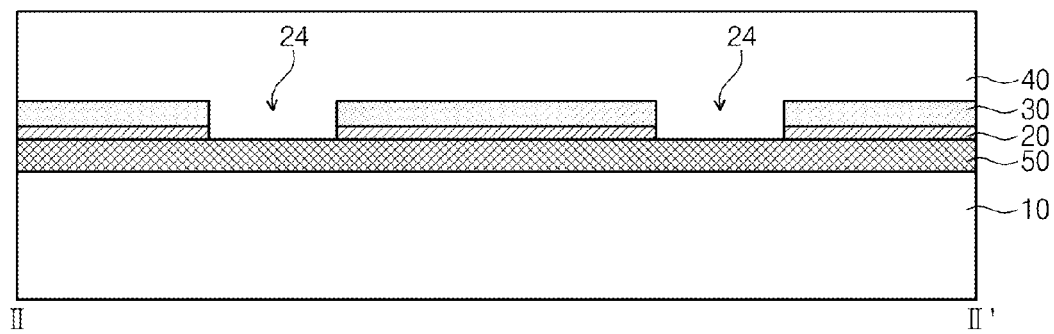

Referring to FIG. 20, the epitaxial semiconductor layer 40 may be planarized. The epitaxial semiconductor layer 40 may cover the stop layer 50 exposed by the grooves 24.

In the method for manufacturing the semiconductor substrate according to embodiments of the inventive concept, the stop pattern may be formed to surround the edge of the base substrate, and the transition layer may be formed to be divided into the center region and the edge region by the stop pattern. Next, the epitaxial semiconductor layer may be formed by the selective isotropic growth method. Thus, the epitaxial semiconductor layer may not be grown from the stop pattern, but it may be grown from the top surface and the sidewall of the transition layer. Due to the selective isotropic growth method, the epitaxial semiconductor layer may gradually cover the stop pattern. When the epitaxial semiconductor layer is grown, the crack may mainly proceed from the edge to the center of the base substrate. The proceeding of the crack may be stopped on the stop pattern. This is because portions of the epitaxial semiconductor layer are separated from each other on the stop pattern.

As a result, the manufacturing method according to embodiments of the inventive concept may prevent the crack badness of the epitaxial semiconductor layer.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method for manufacturing a semiconductor substrate, the method comprising:
    forming a stop pattern surrounding an edge of a substrate;
    forming a transition layer an entire top surface of the substrate except the stop pattern; and
    forming an epitaxial semiconductor layer on the transition layer and the stop pattern,
    wherein the epitaxial semiconductor layer is not grown from the stop pattern; and
    wherein the epitaxial semiconductor layer is isotropically grown from a top surface and a sidewall of the transition layer by a selective isotropic growth method, so that the epitaxial semiconductor layer gradually covers the stop pattern.

2. The method of claim 1, wherein the epitaxial semiconductor layer includes gallium nitride.

3. The method of claim 2, wherein the gallium nitride is formed by a chemical vapor deposition method or an atomic layer deposition method.

4. The method of claim 1, wherein the transition layer includes a superlattice layer.

5. The method of claim 4, wherein the superlattice layer includes a stack structure of aluminum nitride and gallium nitride.

6. The method of claim 5, wherein the aluminum nitride and the gallium nitride of the superlattice layer are formed by a chemical vapor deposition method or an atomic layer deposition method.

7. The method of claim 1, wherein the transition layer is formed by a selective anisotropic growth method, so that the transition layer is not grown from the stop pattern but is grown from an exposed top surface of the substrate.

8. The method of claim 7, further comprising:
    forming a buffer layer between the substrate and the transition layer.

9. The method of claim 8, wherein the buffer layer includes aluminum nitride.

10. The method of claim 1, wherein the stop pattern includes silicon oxide or silicon nitride.

11. The method of claim 10, wherein the silicon oxide is formed by a selective thermal oxidation process.

12. The method of claim 1, wherein forming the stop pattern comprises:
    forming a trench in the substrate;
    forming a dielectric layer on an entire surface of the substrate; and
    planarizing the dielectric layer until the substrate is exposed.

13. A method for manufacturing a semiconductor substrate, the method comprising:
    sequentially forming a stop layer and a transition layer on a substrate;
    patterning the transition layer to form a groove surrounding an edge of the substrate, the groove exposing the stop layer; and
    forming an epitaxial semiconductor layer on the transition layer and the stop layer,
    wherein the epitaxial semiconductor layer is not grown from the stop layer exposed by the groove; and
    wherein the epitaxial semiconductor layer is isotropically grown from a top surface and a sidewall of the transition layer by a selective isotropic growth method, so that the epitaxial semiconductor layer gradually covers the stop layer exposed by the groove.

14. The method of claim 13, wherein the epitaxial semiconductor layer includes gallium nitride.

15. The method of claim 13, wherein the transition layer includes a superlattice layer.

16. The method of claim 15, wherein the superlattice layer includes a stack structure of aluminum nitride and gallium nitride.

17. The method of claim 16, wherein the aluminum nitride and the gallium nitride of the superlattice layer are formed by a chemical vapor deposition method or a sputtering method.

18. The method of claim 13, further comprising:
    forming a buffer layer between the stop layer and the transition layer.

19. The method of claim 18, wherein the buffer layer includes aluminum nitride.

20. The method of claim 13, wherein the stop layer is formed of silicon oxide or silicon nitride by a thermal oxidation process or a chemical vapor deposition process.

* * * * *